United States Patent [19]

Wadsworth

[11] Patent Number: 4,983,930
[45] Date of Patent: Jan. 8, 1991

[54] CURRENT CONVEYOR

[76] Inventor: Douglas C. Wadsworth, Box 977, Manotick, Ontario, Canada, K0A 2N0

[21] Appl. No.: 451,237

[22] Filed: Dec. 15, 1989

[30] Foreign Application Priority Data

Dec. 29, 1988 [CA] Canada .................................. 587,317

[51] Int. Cl.$^5$ .............................. H03F 3/04; 330 288; 323 315; 323 316
[52] U.S. Cl. ..................................... 330/288; 323/315
[58] Field of Search .................. 330/288; 323/315, 316

[56] References Cited

U.S. PATENT DOCUMENTS 3,582,689  6/1971  Smith et al. .......................... 307/297
3,619,798 11/1971  Smith et al. ...................... 330/295 X

FOREIGN PATENT DOCUMENTS 0022112  2/1984  Japan .................................. 323/315
2088662  9/1981  United Kingdom .
2078036 12/1981  United Kingdom .

OTHER PUBLICATIONS

"The Current conveyor: A New Circuit Building Block", by K. C. Smith and A. Sedra Proc. IEEE, vol. 56, pp. 1368–1369, Aug. 1968.
"A New Simple Wide-Band Current-Measuring Device", by K. C. Smith and A. S. Sedra IEEE Trans. Inst. and Meas., vol IM-18, pp. 125–128, Jun. 1969.
"A Monolithic Junction FET NPN", by George R. Wilson, IEEE J. Solid State Cir. vol. SC-3, pp. 380–387, Dec. 1968.
"A Second-Generation Current Conveyor and Its Applications", by A. Sedra and R. C. Smith, IEEE Trans. Circuit Theory, vol. CT-17, pp. 132–134, Feb. 1970.
"Gyrator Implementation With Integrable Current Conveyors", by G. G. A. Black, R. T. Friedmann and A. S. Sedra, IEEE J. Solid State Circuits, vol. SC-6, pp. 396–399, Dec. 1971.
"A High Output Resistance Current Source", by Richard C. Jaeger, IEEE J. Solid State Circuits, vol. SC-9, pp. 192–194, Aug. 1974.
"A Current Conveyor Realization Using Operational Amplifiers", by M. Sharif-Bakhtiar and P. Arohnhime, Int. J. Electronics, vol. 45, No. 3, pp. 283–288, 1978.
"Novel Circuit Implementation of Current Conveyors Using an O.A. and an O.T.A.", by R. Senani, Electronics Letters, vol. 16, No. 1, 1980.
"Circuit Implementation of Current Conveyor", by J. L. Huertas, Electronics Letters, vol. 16, 1980.
"Current Conveyors: A Review of the State of the Art", by Umesh Kumar, IEEE Circuit and Systems Mag. vol. 3, No. 1, 1981.
"An Accurate Integrated Voltage-to-Current Converter", by A. T. Van Zanten and J. H. Huijsing, IEEE J. Soild State Circuits, vol. SC-10, Dec. 1975.
"Report on the VCT", by R. Harris, ETI Canada Magazine, Feb. 1977.

(List continued on next page.)

Primary Examiner—James B. Mullins
Attorney, Agent, or Firm—Thomas Adams

[57] ABSTRACT

In the class of electronic circuits known as current conveyors, limitations in the areas of frequency bandwidth, transient response, output impedance, distortion, accuracy, and suitability for integration are overcome by means of a current conveyor comprising a Wilson current mirror of one polarity type cross-coupled with a second Wilson current mirror of the opposite polarity type. The first Wilson current mirror is connected to an input port and a reference port. The second Wilson current mirror is supplied with current by a current-splitting circuit which also supplies an output port with a currrent that is proportional to, preferably half, the current supplied to the second current mirror. An emitter de-generation compensation scheme may optimize the transient response and stability of the mirrors. The current splitter may also comprise current mirrors. A voltage-to-current converter may be realised by connecting suitable resistors in series with the input and reference ports, respectively.

15 Claims, 6 Drawing Sheets

OTHER PUBLICATIONS

"*A Novel Integrable Voltage-Current Converter*", by R. W. J. Barker and B. L. Hart, IEEE J. Solid State Cir., vol. SC-22, No. 1, Feb. 1987.

"*Wideband Translinear Current Convertor*", A. Fabre, Electronics Letters, Mar. 1984.

"*D. C. Matching Errors in the Wilson Current Source*", by B. L. Hart and R. W. J. Barker, Electronis Letters, vol. 12 1976.

"*Low Distortion Feedback Voltage-Current Conversion Technique*", by B. Wilson Electronics Letters, vol. 17, pp. 157–159, Feb. 1981.

"*High-Performance Current Conveyor Implementation*", by B. Wilson, Electronices Letters, vol. 20, pp. 990–991, Nov. 1984.

"*Accurate Current Follower*", by F. J. Lidgey and C. Toumazou, Electronics and Wireless World, pp. 17–19, Apr. 1985.

"*Floating Impedance Convertors Using Current Conveyors*", by F. J. Lidgey and C. Toumazou, Electronics Letters, vol. 21, pp. 640–642, Jul. 1985.

"*Floating FDNR Employing a New CCII Conveyor Implementation*", by B. Wilson, Electronics Letters, vol. 21, pp. 996–997, Oct. 1985.

"*Using Current Conveyors*", by B Wilson, Electronics and Wireless World, pp. 28–32, Apr. 1986.

"*Universal Active Filter Using Current Conveyors*", by F. J. Lidgey and C. Toumazou, Electronics Letters, vol. 22, pp. 662–664, Jun. 1986.

"*Wide-Band Precision Rectification*", by F. J. Lidgey and C. Toumazou, IEE Proc. G. Electron. Circ. & Syst., vol. 134, pp. 7–15, Feb. 1987.

"*Fast Current-Mode Precision Rectifier*", by F. J. Lidgey and C. Toumazou, Electronics and Wireless World, Nov. 1987.

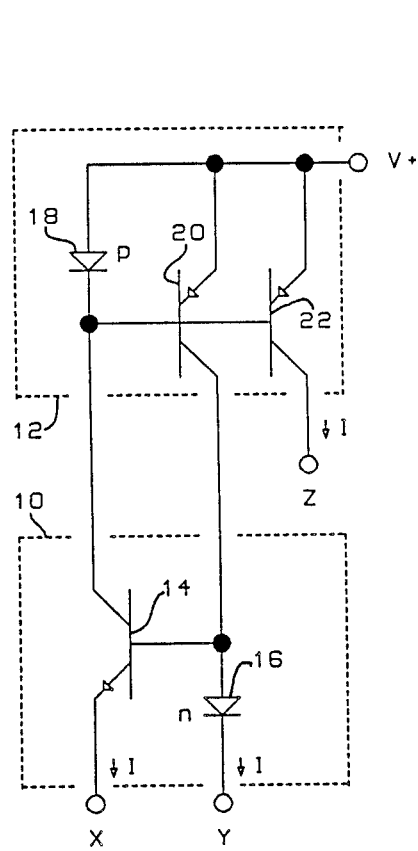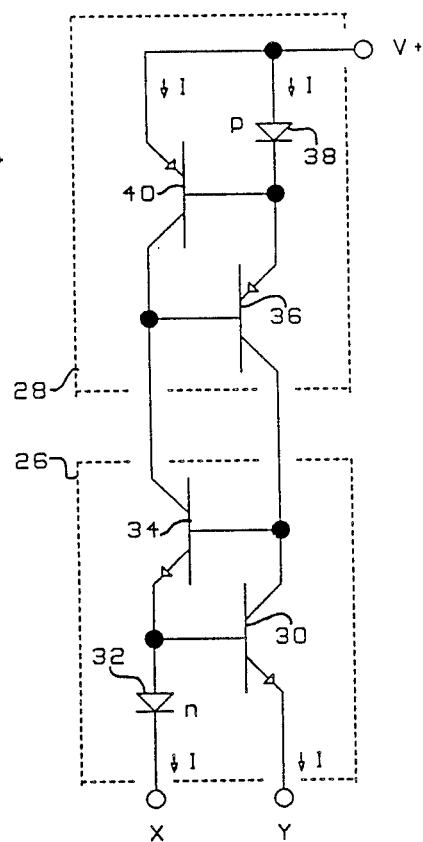
*Fig. 1*  *Fig. 2*
*Prior Art*

CURRENT CONVEYOR

FIELD OF THE INVENTION

The present invention relates to electronic circuits and especially to electronic circuits known as "current conveyors".

BACKGROUND

The circuit concept now known as the "current conveyor" was disclosed by K. C. Smith and A. Sedra in a paper entitled "The Current Conveyor: A New Circuit Building Block," proc. IEEE Vol. 56, pp. 1368-1369, Aug. 1968 and also in U.S. Pat. No. 3,582,689, issued June 1, 1971. Both of these documents are incorporated herein by reference.

The circuit building block embodying this concept was termed a first generation current conveyor or CCI. In the aforementioned documents, Smith and Sedra disclosed an elementary implementation which was not entirely satisfactory because of severe distortion and accuracy limitations due to base current errors and output impedance restrictions resulting from the "Early" voltage effect on the output transistor.

In 1969, Smith and Sedra disclosed a more accurate realization of the CCI in a paper entitled "A Few Simple Wide-band Current Measuring Device," IEEE Trans. Inst. and Meas., Vol. IM-18, pp. 125-128, June 1969, which is incorporated herein by reference. With the circuit in this disclosure, they attempted to compensate for the previously mentioned base current errors ant utilized a Wilson type of current mirror to improve the output impedance. In this specification, the term "Wilson current mirror" is used to donate a current mirror as disclosed by G. R. Wilson in a paper entitled "A Monolithic Junction FET-NPN Operational Amplifier," IEEE J. Solid State Cir. Vol. SC-3, pp. 380-387, December 1968, which is incorporated herein by reference. The Smith and Sedra circuit had a major practical limitation in that all transistors, including both NPN and PNP types, were required to match each other in current gain in order to realize the improved accuracy. This requirement cannot be met with any conventional type of integrated circuit processing where transistors of a like polarity match each other, but NPN and PNP current gains can differ widely. Additionally, although the Wilson mirror improved the output impedance, it was still only half that which could be realized with a pure cascode circuit.

In a paper entitled "A Second Generation Current Conveyor and its Applications," IEEE Trans. Circuit Theory, Vol. Ct-17, pp. 132-134, February 1970, which is incorporated herein by reference, K. C. Smith and A. Sedra disclosed another building block based upon the CCI concept but with different terminal characteristics. This was captioned the "second generation current conveyor" or CCII and was the subject of U.S. Pat. No. 3,619,798, issued Nov. 9, 1971, which is incorporated herein by reference. However, the accuracy of this implementation was limited by base current errors and output impedance in a manner similar to that previously described for the CCI.

In a current conveyor, current is conveyed between a low impedance input port and a high impedance output port. The current is ideally unaltered except for impedance level. A reference port is used to define the voltage level of the input port. In a first generation current conveyor or CCI, the reference port must support a current equal to the that which is conveyed between the input and output ports, whereas a second generation current conveyor or CCII is so configured that the reference port is high impedance. As such, the CCII reference port can perform its potential definition function while only supporting a very small (ideally zero) current.

In a paper entitled "Gyrator Implementation with Integrable Current Conveyors," IEEE J. Solid State Circuits, Vol. SC-6, pp. 396-399, December 1971, which is incorporated herein by reference, G. G. A. Black, R. T. Friedmann and A. S. Sedra disclosed a CCII using an operational amplifier and external transistors. They stressed the importance of using a cascode configuration to obtain high output impedance, but did not indicate how this could be done without introducing base current errors. In addition, their curcuit was subject to the frequency and transient response limitations of the operational amplifier.

In a paper entitled "A High Output Resistance Current Source," IEEE J. Solid-State Circuits, Vol. SC-9, pp. 192-194, August 1974, which is incorporated herein by reference, R. C. Jaeger discussed in detail the output impedance limitations of the Wilson and cascode current sources. As an improvement, he suggested an emitter referenced cascode current source, but the biasing of the bipolar realization of this idea was relatively complex, and the transient response was poor.

Between 1978 and 1980, a number of researchers disclosed implementations of current conveyors using operational amplifiers alone or in combination with operational transconductance amplifiers in an attempt to define a block that was suitable for integration. These disclosures included "A Current Conveyor Realization using Operational Amplifier, " Int. J. Electronics, Vol. 45, No. 3, 1978, by M. Sharif-Bakhtiar and P. Aronhime, "Novel Circuit IMplementation of Current Conveyors Using an O.A. and an O.T.A.," Electronics Letters, Vol. 16, No. 1, 1980, by R. Senani, and "Circuit Implementation of Current Conveyor," Electronics Letters, Vol. 16, 1980, by J. L. Huertas, and are incorporated herein by reference. However, these approaches were all limited by the performance of the operational amplifiers and required tight resistor matching to avoid seriously degraded performance.

In an effort to minimize the disadvantages of using operational amplifiers as building blocks for current conveyors, in a paper entitled "High-Performance Current Conveyor Implementation", Electronics Letters, Vol. 20, pp. 990-991, November 1984, which is incorporated herein by reference B. Wilson proposed to sense the output stage current in an operational amplifier and produce a current conveyor function with appropriately connected current mirrors. In particular, the positive and negative supply pins on a standard operational amplifier have been utilized to implement this idea. For a given operational amplifier, this approach improved the frequency response when compared with the operational amplifier circuits previously described, but transient response, accuracy, distortion, and output impedance remained problematic.

In a review of the state of the art of current conveyors in a paper entitled "Current Conveyors: A Review of the State of the Art," IEEE Circuit and Systems Mag., Vol. 3, No. 1, 1981, which is incorporated herein by reference, U. Kumar outlined the many applications of both the CCI and CCII circuits, but no new realizations of this circuit concept were presented. A number of other authors have similarly addressed only application related issued.

Several other papers in the literature in fact disclose variants on the current conveyor concept, although they are not identified as such. In a paper entitled "An Accurate Integrated Voltage to Current Converter," IEEE J. Solid State Circuits, Vol. SC-10, December 1975, which is incorporated herein by reference, A. T. Van Zanten and J. H. Huijsing described a voltage-to-current converter. They made progress in the areas of accuracy and distortion, but the complexity of the feedback loop resulted in poor transient response. In a paper entitled "Report on the VCT," ETI Canada Magazine, February 1977, which is incorporated herein by reference, R. Harris outlined a similar concept called the "Voltage to Current Transactor" or VCT. As before, accuracy and distortion were improved, but output impedance was limited to that of the Wilson mirror. Another voltage-current converter was detailed by R. W. Barker and B. L. Hart in a paper entitled "A Novel Integrable Voltage-Current Converter", IEEE J. Solid State Cir., Vol SC-22, February 1987, which is incorporated herein by reference. Base current errors in this circuit, however, resulted in degraded accuracy, and the current mirror used had very poor transient response.

In a paper entitled "Wideband Translinear Current Converter", Electronics Letters, March 1984, which is incorporated herein by reference, A. Fabre disclosed a complementary configuration, using a Wilson current mirror and a six transistor output circuit. This arrangement, however, had first order base current errors, and although the configuration was apparently intended to give a higher output impedance, it would seem to give only one half of that of a pure cascode circuit.

Accordingly, although the current conveyor has attracted the interest of a considerable number of researchers over the last twenty years, it is evident that performance enhancements are still required to address the range of applications for this device.

An object of the present invention is to eliminate or at least amerliorate these various disadvantages outlined above.

BRIEF SUMMARY OF THE INVENTION

According to one aspect of the present invention, there is provided a current conveyor comprising an input port, a reference port, and an output port. A first current mirror is connected to said input port and said reference port and comprises bipolar transistors of one polarity type. The first current mirror is cross-coupled with a second current mirror comprising bipolar transistors of another polarity type. Means is provided for supplying current to said second current mirror and to said output port, the current supplied to the output port being proportional to the current supplied to the second current mirror.

According to a second aspect of the invention, there is provided a second generation current conveyor or CCII comprising a current conveyor according to the first aspect but with an additional transistor and diode connected in series with the reference port and the input port, respectively, of the first current mirror.

According to a third aspect of the invention, there is provided a voltage-to-current converter comprising a current conveyor according to the second aspect, a resistor in series with the input port, and a matching resistor in series with the collector of said additional transistor.

Each current mirror means may comprise a Wilson current mirror.

Preferred embodiments of the present invention comprise a complementary interconnection of Wilson current mirrors and an emitter de-generation compensation scheme to optimize the transient response and stability of the said mirrors. Preferably, the current supplying means comprises an output current mirror arrangement which provides an enhanced output impedance that is twice that of the Wilson circuit. This enhancement increases the output impedance to that of a pure cascode configuration without significantly disturbing the base current error cancellation incorporated into the preceding mirrors. Also, this base current error cancellation scheme requires only that transistors of like polarity match each other so, unlike many prior art circuits, compatibility with standard integrated circuit processing is maintained. Short local feedback loops and compensation around each mirror, and an absence of any global negative feedback, may substantially eliminate the possibility of transient intermodulation distortion being produced.

According to a fourth aspect of the invention, a current mirror comprises diode means, a first transistor having its base connected to one terminal of the diode means, the emitter of the first transistor and the other terminal of the diode means being connected to a power supply, and a second transistor having its base connected to the collectors of the first transistor and its emitter connected to said one terminal of the diode means, each of the transistors and the diode means being closely matched, a third transistor having its collector-emitter circuit connected in the same conduction direction as the second transistor between the second transistor and an output port and its base connected to a bias terminal, and a fourth transistor having its collector-emitter circuit connected in series with a second bias terminal and the power supply, the base of the fourth transistor being connected to the base of the first transistor.

BRIEF DESCRIPTION OF THE DRAWINGS

Other features and advantages of the invention will be apparent from the following specific description of preferred embodiments, described by way of example only and with reference to FIGS. 2 through 7 of the accompanying drawings, in which:

FIG. 1 is a schematic diagram of a PRIOR ART "current conveyor" circuit;

FIG. 2 is a schematic diagram illustrating a first step in implementing a current conveyor using Wilson current mirrors;

SPECIFIC DESCRIPTION OF A PREFERRED EMBODIMENT

Figure 3:
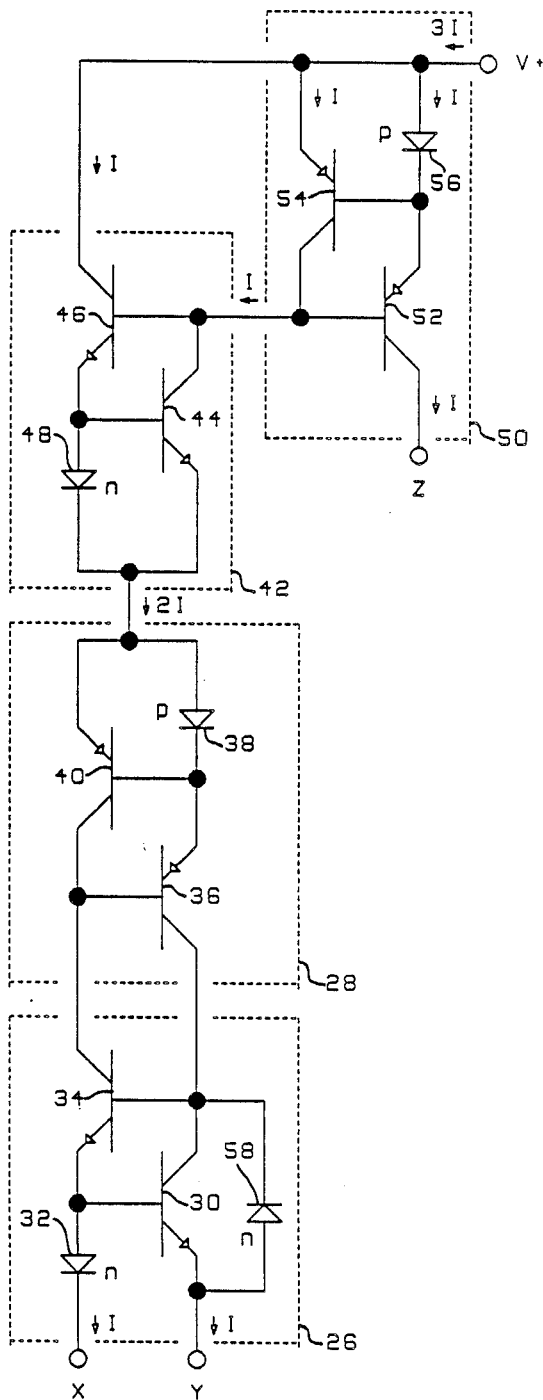
FIG. 3 is a schematic diagram of a current conveyor comprising a first embodiment of the invention and using Wilson current mirrors.

In the drawings, diode symbols with the letter "n" or "p" represent NPN and PNP diode-connected transistors, respectively, where the base and collector terminals are shorted together. All transistors of like polarity are of identical size and construction to ensure matching.

Referring now to FIG. 1, a known implementation of a basic, first generation current conveyor (CCI) comprises two cross-coupled simple current mirrors 10 and 12, respectively. Current mirror 10 is formed by NPN transistor 14 and diode 16, respectively, the anode of diode 16 being connected to the base of transistor 14. In operation of the current mirror, current is supplied to the junction between the anode of diode 16 and the base of the transistor 14. As this current flows through diode 16, the voltage developed across diode 16 biases transistor 14. Since diode 16 is made by shorting the collector and base of a transistor that is identical to transistor 14, the characteristics of diode 16 and the base/emitter junction of transistor 14 are identical. To a first order i.e. ignoring the base current flowing into transistor 14, the current driven through diode 16 will be exactly the same as the current flowing into the collector of transistor 14. This current can be replicated as many times as desired simply by connecting more transistors like transistor 14 in parallel with transistor 14, and coupling their bases to the base of transistor 14. Of course, each additional transistor draws more base current which tends to alter the accuracy with which the duplication takes place.

The emitter of transistor 14 and the cathode of diode 16 are connected to input port X and reference part Y, respectively.

Current mirror 12 comprises a diode 18 and PNP transistor 20, connected in a similar manner to the first current mirror 10, but with the anode of diode 18 connected to the emitter of transistor 20. An output transistor 22 is connected in parallel with transistor 20 and has its collector connected to an output terminal Z.

If port Y is held at a reference potential, and current is sourced from port X, then to a first order, the current delivered from port Z, and also that delivered from port Y, is equal to that sourced from port X. Of particular interest is the fact that port X will be driven to the same potential as port Y, regardless of the current levels being sourced. Therefore, if port Y is referenced to ground, then port X becomes a virtual ground or low impedance input and, conversely, port Z becomes a high impedance output.

In summary, current which is sourced from low impedance input port X is conveyed to high impedance output port Z, unaltered, except for impedance level.

The main limitation of the simple first generation current conveyor shown in FIG. 1 is that the base currents of the transistors introduce a significant error in the accuracy with which current sourced from port X matches that sourced from ports Y and Z. This error is of the order of $100\beta$ percent where $\beta$ is the forward current gain of the transistors. The magnitude of this deviation can easily reach 1 percent or more, and results in a circuit which is unacceptable for most applications. In addition, the Early voltage or output conductance effect of transistor 22 causes a further degradation in performance.

It is known that the Wilson current mirror provides much improved accuracy through a base current cancellation scheme which results in errors of the order ob $200/(\beta^*\beta)$ percent. If the simple current mirrors of FIG. 1 were replaced with Wilson current mirrors, a much more accurate current conveyor would be obtained. In fact, this approach was investigated by Smith and Sedar [IEEE Trans. Inst., June 1969], but apparently they are succeeding researchers were unable to realize a practical implementation.

FIG. 2 illustrates the concept of the present invention which entails implementing a current conveyor by means of cross-coupled Wilson current mirrors 26 and 28, respectively. In FIG. 2, the first Wilson mirror 26 comprises an NPN transistor 30 and a diode 32, the base of transistor 30 being connected to the anode of diode 32. In this case, the cathode of diode 32 is connected to input port or terminal X and the emitter of transistor 30 is connected to reference port or terminal Y. A second NPN transistor, 34, has its base connected to the collector of transistor 30 and its emitter connected to the anode of diode 32.

The second Wilson current mirror 28 comprises a PNP transistor 36 with its collector connected to that of transistor 30 and its base connected to the collector of transistor 34. The emitter of transistor 36 is connected by way of a diode 38 to a voltage source V+ and also to the base of transistor 40 which has its collector connected to that of transistor 34 and its emitter connected to voltage source V+.

In effect, then, the two Wilson current mirrors are cross-coupled. This arrangement enables accurate conveying of current between ports X and Y, but it is not apparent how port Z can be implemented in practice, i.e. how a current can be extracted. Any attempt to add an output port in a manner similar to that of transistor 22 in FIG. 1 would destroy the base current cancelation scheme.

It should be noted that the current drawn from the supply V+, is equal to twice the value of each of the equal currents sourced form ports X and Y respectively.

Referring now to FIG. 3, in which components corresponding to components in FIG. 2 have the same reference numeral, four Wilson current mirrors are used to produce an embodiment of a first generation current conveyor or CCI. An NPN Wilson current mirror 26 and a PNP Wilson current mirror 28 are connected as was shown in FIG. 2. As noted above, the current drawn by current mirror 28 (in FIG. 2, from the supply V+), is equal to the sum of the equal currents sourced from ports X and Y respectively.

A third Wilson mirror 42, comprising NPN transistors 44 and 46 and a diode 48 connected in a similar manner to the corresponding components of current mirror 26, serves to perform a current splitting action. The current (2I) at the junction between the emitter of transistor 44 and the cathode of diode 48 is divided by current mirror 42 such that half is provided through transistor 46 from the supply (V+), and the remainder is delivered from an output Wilson current mirror 50. This output current mirror 50 comprises PNP transistors 52 and 54 and diode 56 connected in a similar manner to current mirror 28, the collector of transistor 52 comprising the output port Z.

The third current mirror 42 has first and second terminals comprising the collectors of transistors 46 and 44, respectively. The first terminal is connected directly to supply (V+) and the second terminal is connected to the base of transistor 52 in the output current mirror 50.

It will be seen from FIG. 3 that the supply V+ supplies triple the current I sourced by port X or port Y. This current is distributed equally between transistor 46, transistor 54, and diode 56. The resulting current sourced from port Z is equal to I, the current which is sourced from port X or port Y.

This practical implementation maintains the excellent accuracy of the Wilson current mirror.

There is a remote possibility that the two cross-coupled Wilson mirrors 26 and 28 might not "start" when the circuit is first powered up. This situation may result because transistor 34 generates its own base drive through the PNP current mirror 28. If transistor 34 is off, it needs base drive to turn on, but it cannot produce base drive until it has turned on. Leakage currents would almost certainly overcome this contradiction, but the addition of a diode 58 across the emitter and collector of transistor 38 ensures that, if necessary, a turn-on path would be established when the voltage at port X fell three diode drops (a voltage equal to three times the forward bias voltage of the diode) below port Y, thereby forcing current to flow through diode 58 into the base of transistor 34. Once the mirrors start up, diode 58 is reverse biased and has no effect on the normal operation of the current conveyor.

Various modifications or refinements are possible to realize the full potential of this circuit. In a paper entitled "D.C. Matching Errors in the Wilson Current Source", Electronics Letters, Vol. 12, 1976, which is incorporated herein by reference R. W. J. Barker and B. L. Hart showed that an additional diode connected in series with the collector of one of the transistors in the Wilson current mirror would improve its accuracy. Such diodes 60, 62, 64 and 66, may therefore be inserted in series with the collector leads of transistors 30, 40, 44, and 54, respectively, as in the modified current conveyor shown in FIG. 4.

Figure 4:
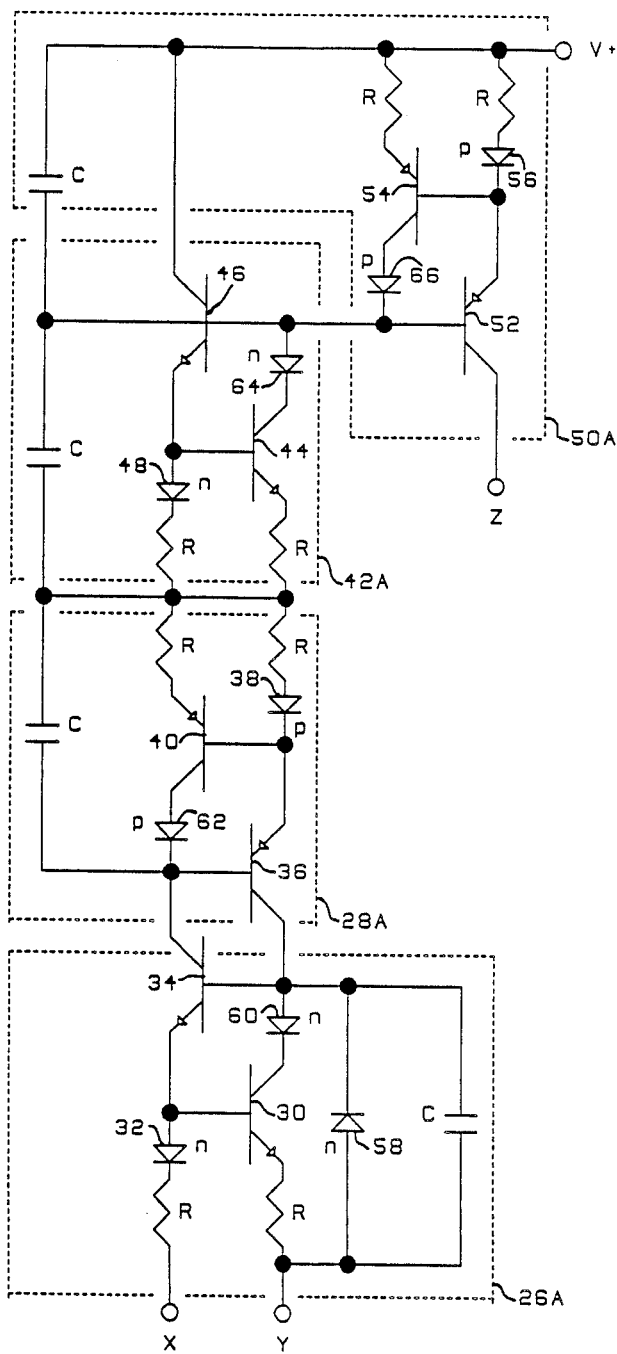
FIG. 4 is a schematic diagram illustrating a modification of the circuit of FIG. 3 with enhancements for accuracy and stability.

FIG. 4 illustrates another modification which may be employed to ameliorate any tendency for the Wilson current mirror to ring or overshoot on fast pulse waveform edges. This is of itself undesirable, but it may become a serious problem with the two cross-coupled mirrors 26 and 28. The overshoot actually results from the fact that the current gain of the Wilson current mirror becomes greater than unity at high frequencies. Such a situation, along with parasitic capacitance on port X, can cause the loop gain around current mirrors 26 and 28 to exceed unity, with potential oscillation the result. The solution illustrated in FIG. 4 is to employ matching emitter degeneration resistors R, in series with each of the Wilson current mirrors and then capacitors C across each of the current mirrors 26A, 28A, 42A and 50A to roll off the high frequency gain. The RC time constant is chosen to optimize the transient response to a critically damped characteristic, consistent with the parameters of the transistors utilized. These resistors R have the added advantage of improving the accuracy of the current mirrors.

Figure 5:
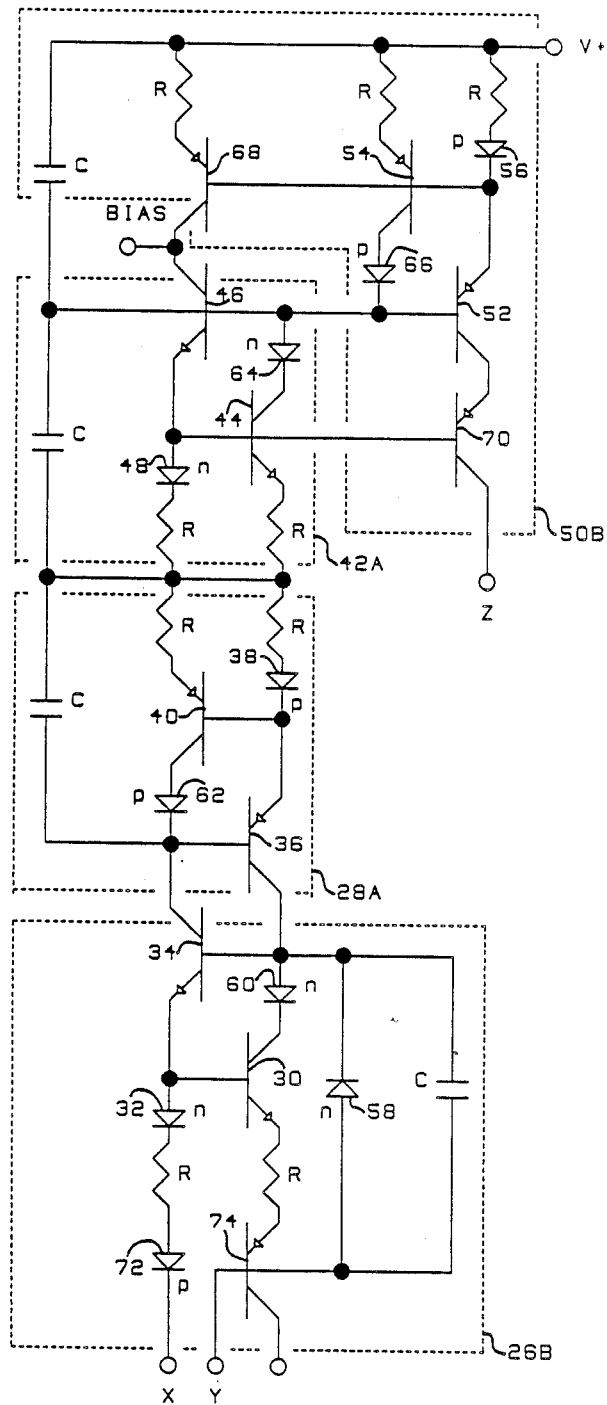
FIG. 5 is a schematic digram of an embodiment of the invention incorporating two further modifications to the circuit of FIG. 4 relating to output impedance and flexibility of application.
Figure 6:
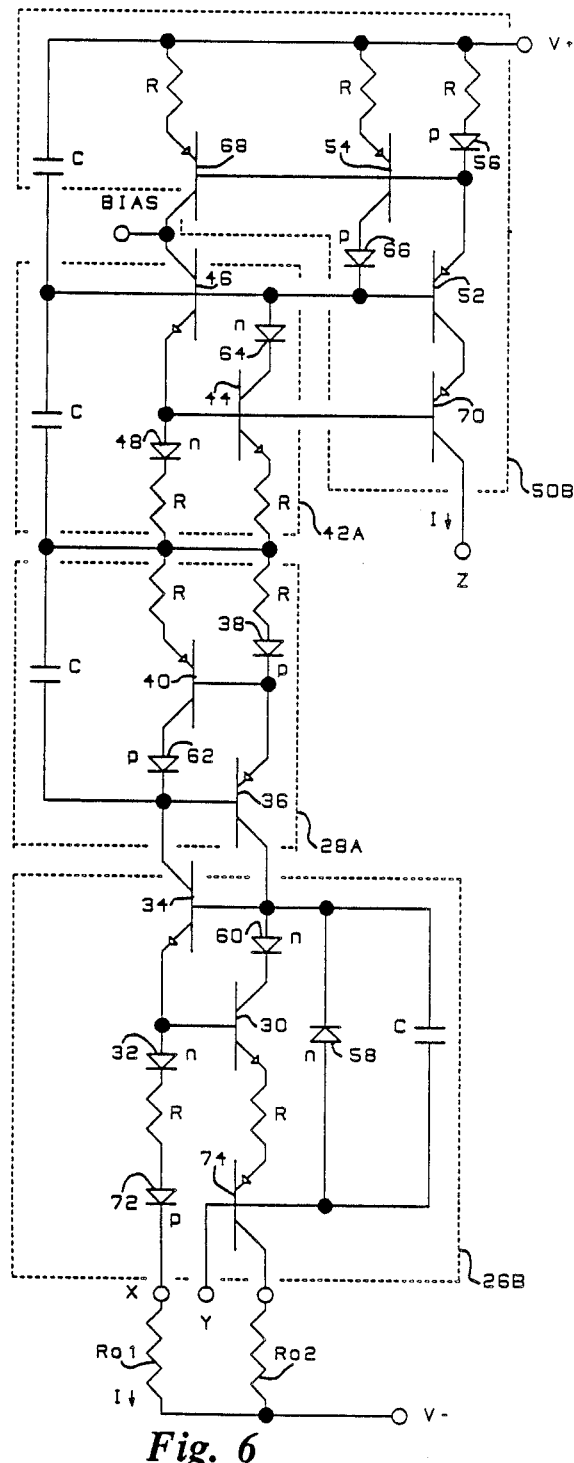
FIG. 6 is a schematic diagram of an embodiment of the invention that is operable as a voltage to current converter.

FIGS. 5 and 6 illustrate two further enhancements to the circuit of FIGS. 3 and 4. In FIGS. 5 and 6, components corresponding to components in FIGS. 3 and 4 have the same reference numerals.

Referring to FIG. 5, PNP transistor 70 is interposed between the collector of transistor 52 and the output port Z. The base of transistor 70 is connected in common with the base of transistor 44 to diode 48. Transistor 70 serves as a cascode transistor which raises the output resistance of the modified PNP Wilson mirror consisting of transistors 52, 54 and diodes 56 and 66. The biasing of the base of transistor 70 from the NPN current splitting mirror 42A, comprising transistors 44 and 46 and diodes 48 and 64, is such that this base error current is shunted up to V+ supply with the unused half of the split current. As a result, the accuracy of the NPN current splitter mirror 42A is not compromised. There is, however, a potential for major error in the output current, as base current is subtracted as it flows from the emitter to the collector of transistor 70. This is reduced to a negligible error by introducing a balancing base current by means of a second PNP transistor 68, which has its base connected in common with that of transistor 54. Since this transistor 68 and its emitter resistor match transistor 54 and diode 56 in current mirror 50B, two base currents are injected into the current mirror 50B at the cathode of diode 56 to cancel the first loss in transistor 52 and the second loss in transistor 70. The collector of transistor 68, through which a "wasted" current flows, is shown connected to the collector of transistor 46 which carries the unused half of the split current. These two extraneous currents are very nearly equal, and so virtually cancel. This allows the collectors of transistors 46 and 68 to be tied to any convenient bias point (BIAS) about two diode drops below the voltage of supply V+, even if it is relatively high impedance, as only a small difference current needs to be supported. The end result is that the output resistance of port Z is doubled at the expense of an increase in the base current error from approximately $200/\beta^*\beta$ percent to $500/\beta^*\beta$ percent where $\beta$ is the forward current gain of the transistors. This is negligible when weighed against the benefits of improved output resistance.

FIG. 5 also shows an additional diode 72 connected in series with input port X and an additional PNP transistor 74 with its emitter connected by way of the associated resistor R to the emitter of transistor 30. The base of transistor 74 is connected to reference port Y. The collected of transistor 74 becomes an additional terminal which may be connected in one or the other of two different configurations to realize either a CCI of CCII current conveyor.

A first generation current conveyor or CCI is realized if the collector terminal of transistor 74 is connected in common with reference terminal Y. Since this shorts together the collector and base of transistor 74, a diode is created. Therefore, the basic operation of the circuit as a first generation current conveyor remains unchanged from that of FIG. 4, except that an additional diode drop has been added in series with ports X and Y respectively.

A useful implementation of a second generation current conveyor (CCII) is realized if transistor 74 is utilized as a transistor. In this configuration, the collector of transistor 74 is returned to a separate, more negative supply and its base functions as reference port Y. As with the first generation current conveyor, (CCI), the voltages at ports X and Y are forced to be equal and current sourced from port X is conveyed to port Z unchanged, except for impedance level. The current at port Y, however, no longer matches that at X and Z and is in fact reduced by the forward current gain of transistor 74 with respect to the current at port Y in a first generation current conveyor, This approximates the terminal characteristics of a second generation current conveyor which ideally requires that the current at port Y be zero. Even though the condition at port Y is non-ideal, this does not affect the utility and accuracy of this realization in many applications.

In summary, the circuit of FIG. 5 can be configured as a first generation current conveyor of high accuracy, optimized transient response, and enhanced output impedance. Only transistors of like polarity are required to match to achieve this performance, thereby facilitating integrated circuit fabrication. In addition, a useful realization of a second generation current conveyor or CCII can also be implemented.

FIG. 6, shows a voltage to current converter implemented using the second generation current conveyor configuration of FIG. 5. Identical resistors $R_{01}$ and $R_{02}$ are connected in series with port X and the collector of transistor 74, respectively, and in common to a negative supply V−. Although port Y is still a reference port in the sense that it defines the voltage potential at port X, in this case it is also the input to the voltage-to-current converter. The voltage applied to "Input" port Y will be accurately duplicated at port X, since the currents through diode 72 and the base-emitted junction of transistor 74 are identical, even though the emitter current of transistor 74 subsequently splits between its base and collector. The magnitude of the current sourced from port Z is therefore equal to the input voltage at port Y divided by the value of resistor $R_{01}$ at port X. An additional matching resistor $R_{02}$ between the collector of transistor 74 and the negative supply V− forces its collector to be at virtually the same potential as its base without approximately $100/\beta$ per cent. This reduces the Early voltage errors on transistor 74 to the level of the other errors in the Wilson current mirror and an accurate voltage to current converter results. One advantage of the second generation current conveyor configuration is that the input impedance of the current converter is enhanced by a factor of the forward current gain $\beta$.

It will be obvious to those skilled in the field that each of the NPN transistors could be replaced with a PNP transistor and vice versa so as to produce circuits identical in function to those previously described, but opposite in polarity.

Embodiments of the present invention which use short, local negative feedback loops to reduce distortion and improve accuracy, are advantageously employed in applications such as professional audio and active filter circuits. This is in contrast to the overall global negative feedback associated with most prior art realizations, and particularly those which utilized operational amplifiers, which may potentially introduce transient intermodulation distortion which cannot be tolerated in such applications.

Embodiments of the invention provide a current conveyor which is suitable for integration with conventional integrated circuit processing, has high accuracy, high output impedance, wide bandwidth, low distortion, and good transient response.

As has been documented in the literature, the Wilson current mirror has an output resistance that is more improved over a simple mirror, being approximately $\beta/2$ times greater, where $\beta$ is the forward current gain of the transistors. However, this is still only half that which can be obtained with a pure cascode circuit. As it is desirable to make the output resistance of port Z as high as possible, embodiments of the present invention incorporate a novel scheme whereby the performance of a pure cascode is obtained without introducing any significant errors into the Wilson base current cancelation arrangement.

Figure 7:
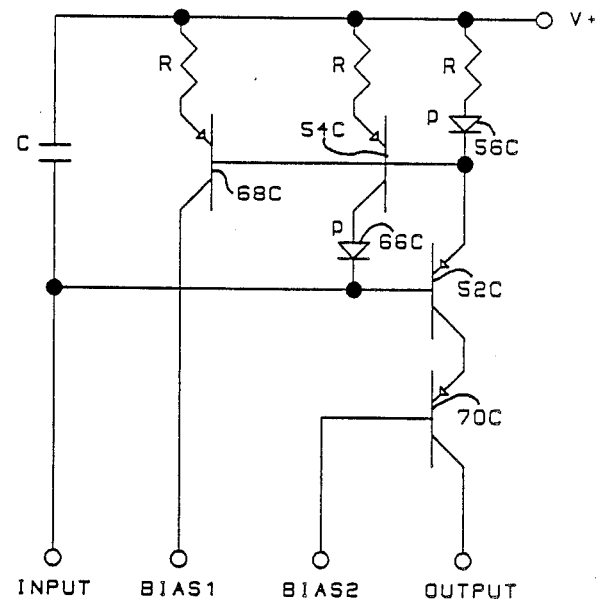
FIG. 7 is a schematic diagram of a current mirror comprising another aspect of the present invention.

FIG. 7 shows an embodiment of another aspect of the present invention, namely a current mirror of similar construction to current mirror 50B, (FIG. 5), but which may be employed in electronic circuits other than current conveyors as an accurate current mirror with an enhanced output impedance. In FIG. 7, the same component numeral designations of FIG. 5 are used with the addition of "C" suffix. Generally, the circuit operates in a similar manner to current mirror 50B of FIG. 5.

Referring to FIG. 7, transistor 70C acts as a cascode transistor which serves to raise the output impedance of the modified PNP Wilson mirror consisting of transistors 52C and 54C, and diodes 56C and 66C. The first order base current error that would otherwise result from this cascode transistor 70C is compensated by introducing an additional base current into the circuit with transistor 68C. This transistor matches transistor 54C and diode 56C, and its collector (BIAS1) should preferably be biased at two diode drops negative of supply voltage V+, to minimize Early voltage errors. A voltage more negative than this preferred potential is acceptable but will result in a degradation in accuracy. The preferred biased point for the base of transistor 70C (BIAS2) is three diode drops negative of supply voltage V+, but a more negative potential is acceptable if the corresponding loss of headroom (swing) can be tolerated. It is essential that BIAS1 and BIAS 2 not be more positive than their previously stated preferred levels, otherwise saturation will result in a loss of functionality. These bias points must also be completely independent of the input and output current paths of the mirror to avoid any loss of accuracy through injection of error currents.

The value of capacitor C is chosen to optimize the transient response of the current mirror to a critically damped characteristic, consistent with the value of resistors R and the transistor parameters.

This enhanced mirror configuration maintains the first order base current error cancellation scheme characteristic of the Wilson mirror, while providing twice the output impedance and optimized transient response. Current source from the input terminal (INPUT) will be replicated and sourced from the output terminal (OUTPUT) with a high degree of accuracy and stability.

It will be obvious to those knowledgeable in the field that a current mirror of opposite polarity may be realized with NPN transistors which will retain the advantageous characteristics described.

It should also be appreciated that the current supplying means described hereinbefore, i.e. comprising two current mirrors 42 and 50, respectively, is designed to given one-to-one proportionally between the currents at the input port (X) and the output port (Z), respectively. In some applications, however, other proportions may be tolerable, or even preferred, in which case the current supplying means may be modified appropriately. For example, referring to the embodiments of FIGS. 3 and 4, the current mirrors 42/42A could be omitted and the second current mirror 28/28A supplied solely from the second source terminal of output current mirror 50, i.e. from the common connection between the collector of transistor 54 and the base of transistor 52. In this alternative embodiment, the current supplied at the output port (Z) will be double the current at the input port (X).

The current mirror shown in FIG. 7 may be enhanced by adding resistors (R), a capacitor (C), and an additional diode 66C, as described with respect to the current mirrors in the current conveyors of FIGS. 2 through 6.

I claim:

1. A current conveyor comprising an input port (X), a reference port (Y) and an output port (Z), a first current mirror (26) connected to said input port and said reference port and comprising bipolar transistors of one polarity type, a second current mirror (28) cross-coupled with said first current mirror and comprising bipolar transistors of the other polarity type, and means (42:50) for supplying current to said second current mirror and to said output port such that the current supplied to said output port is substantially proportional to the current supplied from said input port (X), said current supplying means comprising a third current mirror (42) and an output current mirror (50), the third current mirror comprising bipolar transistors of said one polarity type connected to supply current to said second current mirror (28), said output current mirror (50) comprising bipolar transistors of the other polarity type and having a source terminal connected to said output port and a sink terminal connected to a supply (V+), said third current mirror having a first terminal for receiving current from said supply (V+) and a second terminal for receiving current from said output current mirror (50), such that a current equal to the current provided at said second terminal is provided at the output port.

2. A current conveyor as claimed in claim 1, in which each current mirror comprises diode means (32; 38; 48; 56), a first transistor (30; 40; 44; 54) having its base connected to one terminal of the diode means, and a second transistor (34; 36; 46; 52) having its base connected to the collector of the first transistor and its emitter connected to said one terminal of the diode means, each of the transistors and the diode means being closely matched, the emitter of said first transistor (30) of said first current mirror (26) being connected to said reference port (Y) and the other terminal of said diode means (32) of said first current mirror (26) being connected to said input port (X).

3. A current conveyor as claimed in claim 2, in which the cross-coupling of the current mirrors is comprised of the collector of said second transistor (34) of the first current mirror being connected to the base of said second transistor (36) of the second current mirror, and the collector of said second transistor (36) of the second current mirror being connected to the base of said second transistor (34) of the first current mirror.

4. A current conveyor as claimed in claim 2, in which the diode means (48) and the emitter of the first transistor (44) of the third current mirror (42) are connected together to the diode means (38) and the emitter of the first transistor (40) of the second current mirror (28), the collector of the second transistor (46) of the third current mirror comprising said first terminal and the base of the second transistor (46) of the third current mirror comprising said second terminal.

5. A current conveyor as claimed in claim 2, in which the base terminal of the second transistor (52) of the output current mirror (50) is connected to the base terminal of the second transistor (46) of the third current mirror, the diode means (56) and the emitter of the first transistor (54) of the output current mirror are connected with the collector of the second transistor (46) of the third current mirror to said supply (V+), and the collector of the second transistor (52) of the output current mirror is connected to the output port (Z).

6. A current conveyor as claimed in claim 2, further comprising a diode (60; 62; 64; 66) connected in series with the collector of each said first transistor of each current mirror and polled in the same conduction direction as said first transistor.

7. A current conveyor as claimed in claim 2, wherein said output current mirror further includes a third bipolar transistor (70) of polarity type similar to the first and second transistors of the output current mirror, said third transistor (70) having its collector-emitter circuit connected in the same conduction direction as the second transistor (52) of the output current mirror and between the second transistor of the output current mirror and the output port (Z), and its base connected to the base of the first transistor of the third current mirror, said output current mirror further including a fourth bipolar transistor (68) of polarity type similar to the transistors of the output current mirror, and having its collector-emitter circuit connected in series with the collector of the second transistor (46) of the third current mirror and the supply (V+) and in the same conduction direction as the second transistor of the third current mirror, the base of the fourth transistor being connected to the base of the first transistor of the output current mirror, and a bias supply being connected to the junction of said fourth transistor and the second transistor of the third current mirror.

8. A current conveyor as claimed in claim 7, further including resistors (R) connected in series with, respectively, the emitter of said fourth transistor of said output current mirror and with the diode means and the emitter of each first transistor of each current mirror, and a capacitor (C) connected between the base of the second transistor of each current mirror and the resistor which is connected to the first transistor at its terminal opposite from its connection to the first transistor, the time constant of the capacitor and each corresponding resistor being selected to optimize the transient response to a critically damped characteristic.

9. A current conveyor as claimed in claim 2, further including resistors (R) connected in series with, respectively, the diode means and the emitter of said first transistor of each current mirror, and a capacitor (C) connected between the base of the second transistor of each current mirror and the resistor which is connected to the first transistor at its terminal opposite from its connection to the first transistor, the time constant of the capacitor and each corresponding resistor being selected to optimize the transient response to a critically damped characteristic.

10. A current conveyor as claimed in claim 2, further comprising a diode (72) connected between the input port and said diode means (32) of the first current mirror, and poled in the same conduction direction as the diode means (32), and a fifth transistor (74) of similar polarity to that of the transistors of the second current mirror and connected with its emitter-base circuit in the same conduction direction as the first transistor (30) of the first current mirror between the reference port and said first transistor (30) of the first current mirror.

11. In combination, a current conveyor as claimed in claim 10, further comprising a pair of resistors, one (Ro1) connected between said input port and a second supply (V−) more negative than said reference port, and the other (Ro2) connected between the collector of said fifth transistor and said second supply (V−).

12. A current conveyor as claimed in claim 11, in which said pair of resistors have equal value.

13. A current conveyor as claimed in claim 2, said first current mirror further comprising a diode connected between the reference port (Y) and the base of the second transistor (34) of the first current mirror (26) and poled in the conductivity direction opposite that of the first diode means of the first current mirror.

14. In combination, a current conveyor as claimed in claim 1, and a resistor connected between the input port and a second supply (V−) more negative than the reference port.

15. A current mirror comprising an input port and an output port, diode means (56C), a first transistor (54C) having its base connected to one terminal of the diode means, the emitter of the first transistor and the other terminal of the diode means being connected to a power supply (V+), and a second transistor (52C), the base of the second transistor and the collector of the first transistor being connected to said input port, the emitter of said second transistor being connected to said one terminal of the diode means, each of the transistors and the diode means being closely matched, a third bipolar transistor (70C) having its collector-emitter circuit connected in the same conduction direction as the second transistor (52C) between the second transistor and said output port and its base connected to a bias terminal (BIAS2), said current mirror further including a fourth bipolar transistor (68C) having its collector-emitter circuit connected in series with a second bias terminal (BIAS1) and the power supply (V+), the base of the fourth transistor being connected to the base of the first transistor.

* * * * *